Aug. 25, 1953 W. A. CLAPS 2,650,296

RADIO FREQUENCY AMPLIFIER

Filed Jan. 16, 1950 2 Sheets-Sheet 1

Inventor
William A. Claps
By Morris Spector
Attorney

Aug. 25, 1953 W. A. CLAPS 2,650,296

RADIO FREQUENCY AMPLIFIER

Filed Jan. 16, 1950

2 Sheets-Sheet 2

Inventor
William A. Claps
By Morris Spector
Attorney

Patented Aug. 25, 1953

2,650,296

UNITED STATES PATENT OFFICE 2,650,296

RADIO FREQUENCY AMPLIFIER

William A. Claps, Chicago, Ill., assignor to Anchor Radio Corporation, Chicago, Ill., a corporation of Illinois Application January 16, 1950, Serial No. 138,897

19 Claims. (Cl. 250—16)

This invention relates to high frequency preamplifiers, particularly a vacuum tube type preamplifier which is intended for use on frequencies encountered in the television spectrum. In its more specific aspects the present invention is especially concerned with a television preamplifier that uses a movable core tuner arrangement.

It is one of the objects of the present invention to provide a preamplifier that is to be used for amplification of frequencies in each of a number of frequency bands selectively, and wherein the arrangement is such as to permit the use of leads of minimum length to and from the vacuum tube of the amplifier as the vacuum tube is switched for amplification from one frequency band to another.

In the construction of multi-band amplifiers operating at frequencies with which the present invention is particularly concerned, is customary to utilize separate sets of tuned circuits for each band within the range involved. Thus, in a conventional television receiver equipped with a high frequency amplifier, commonly termed an R. F. or preamplifier, provision is made for the amplification of frequencies in each of two or more bands or channels. Separate tuned circuits are provided for the respective channels, each of which circuits is tunable over its range. Since each tuned circuit requires an amplifying vacuum tube it is customary to provide the respective tunable circuits with a single amplifying vacuum tube, or set of tubes, and to provide switching means for selectively connecting the same vacuum tube amplifier in any selected one of the tuned circuits. In the case of a tuned circuit operating at the frequencies here involved and wherein the tuning is obtained by shifting the position of a movable magnetic core, there is necessarily appreciable spacing between the coils that are tuned by the core or cores in the different frequency bands. Where a switching arrangement is to be provided for connecting the vacuum tube amplifier to selected ones of the tunable coils the leads between one or more of the spaced coils and the switch that effects the connection must be of a considerable length, that is, at least of a length such that produces objections in the tuned circuit. It is an object of the present invention to provide a structure wherein the lengths of these leads may be reduced to a minimum. In accordance with the preferred embodiment of the present invention the vacuum tube amplifier and some of its circuit components are mounted on a movable section of a switch assembly, which section moves from one position to another to connect the vacuum tube amplifier to desired ones of the different frequency band tuners.

It is a further object of the present invention to arrange two or more sets of permeability tuned radio frequency coils in such relationship that a single magnetic core can be moved selectively in one or the other of the coils to effect the necessary tuning thereof. It is a still further object of this invention to provide such sets of coils with shields between them. In accordance with this feature of the present invention a radio frequency amplifier is provided with tube and circuit components which produce the proper direct current and radio frequency impedances preferably mounted on a moving sectional switch assembly for simple uniform band switching of two or more frequency ranges each having as its tuning components two or more tuning coils to provide for two or more corresponding frequency bands. The two or more tuning coils are mounted on a single sleeve or hollow form to allow changes of the inductance of either of the coils by a straight line motion of a single iron core passing first through one of the coils and then continuously on through the next coil or coils in order. The frequency coverage per coil is determined by the diameter of the coil, and the actual center frequency per band is controlled by the length of the wire per coil. The tunable coils for the respective frequency bands are spaced from one another for isolation, and a metal grounding shield is placed between adjacent coils to increase the isolation.

As previously stated, the amplifier tube and circuit components which produce the proper impedances, such as the tube socket, coils, resistors, and capacitators for the tube are mounted directly on the movable switch member that connects the amplifier tube to the desired frequency range tuned coil. This circumvents the need for other intercomponent wiring for the different frequency bands thereby excluding the possibility of variations in wiring under ordinary production methods, and further providing for equal performance of the radio frequency amplifier, oscillator or mixer stage for each band covered.

The attainment of the above and further objects of the present invention will be apparent from the following specification taken in conjunction with the accompanying drawings forming a part thereof.

Figure 1:
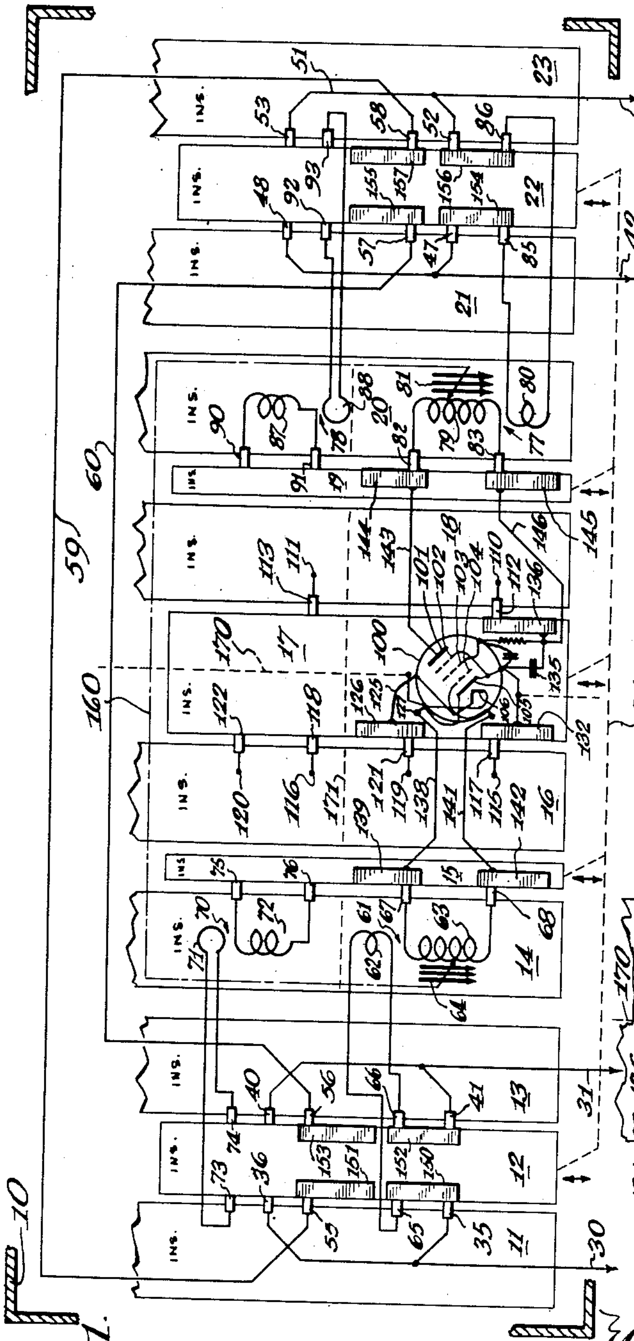
Figure 1 is a schematic circuit diagram of an amplifier of the present invention.

Referring now to Figure 1, there is illustrated an amplifier for high frequencies which is contained within and mounted in a shielding housing or chassis symbolically illustrated at 10. There are illustrated support or mounting members, some of which are fixed relative to the chassis 10, the others of which are movable relative thereto. Each of the fixed mounting members are distinguished by the broken lines at the top ends thereof, as viewed in the said Figure 1, symbolically signifying attachment to said chassis. Beginning at the left hand end of Figure 1, the members are as follows: 11 fixed, 12 movable, 13 fixed, 14 fixed, 15 movable, 16 fixed, 17 movable, 18 fixed, 19 movable, 20 fixed, 21 fixed, 22 movable, and 23 fixed. The movable members are arranged to slide between the fixed members in unison, and for this purpose all are interconnected for gang movement, as indicated symbolically by the broken line 24. In this view, the members all appear as strips of insulating material arranged side by side, slidable, longitudinally of one another. This is merely symbolic, however, since the members may be of any suitable shape or size, may be slidable in any manner, either rectilinearly, circularly, or arcuately, and said members may be arranged as coaxial wafers or discs, or tiers. Obviously there is means for guiding and confining the paths of the movable members, but these are not deemed necessary of illustration.

The illustrated circuit has three different positions for the movable members, namely, the "Band 1" position, the "Off" position, and the "Band 2" position. In the "Band 1" position, which is illustrated in the drawing, the lower of the tuned circuits is being utilized, in the "Off" position the entire amplifier is by-passed, and in the "Band 2" position the upper of the tuned circuits is utilized. Obviously the number of positions may be increased in the event the number of bands and tuned circuits are increased.

The input to the amplifier is obtained by connecting and appropriately matching the same to the input or antenna leads 30 and 31. The input lead 30 extends to contact terminals 35 and 36 on the member 11, which extend into the path of wiper contacts on the movable member 12, on the left hand side thereof. The input lead 31 extends to contact terminals 40 and 41 which also extend into the path of wiper contacts on the movable member 12, albeit on the right hand side thereof.

The output of the amplifier is by way of output leads 42 and 43 which may be connected to the input of a television receiver. The lead 42 extends to contact terminals 47 and 48 on the member 21 and are in the path of wiper contacts on the movable member 22, on the left hand side thereof. The lead 43 extends to contact terminals 52 and 53 which also are on the member 21 and are in the path of wiper contacts on the movable member 22, albeit on the right hand side thereof.

The fixed members 11 and 13 carry juxtaposed contact terminals 55 and 56, respectively, while the fixed members 21 and 23 carry similar contact terminals 57 and 58, respectively. The contact terminals 55 and 58 are connected by the lead 59 while the contact terminals 56 and 57 are connected by the lead 60.

A "Band 1" input transformer 61 is mounted on the bottom portion of the fixed member 14 and consists of a primary 62 and a secondary 63 and a movable magnetic core 64 as of powdered iron. The primary 62 is connected across contact terminals 65 and 66 mounted respectively upon the fixed members 11 and 13. The secondary 63 is connected to contact terminals 67 and 68 which extend into the path of and are engaged by contacts on the movable member 15 on the left hand side thereof. The "Band 2" input transformer 70 is also mounted on the fixed member 14 and consists of a primary 71 and a secondary 72. As will be explained, both transformers 61 and 70 are tuned by means of the same iron core. The primary 71 is connected across terminals 73 and 74, on the members 11 and 13 respectively, while the secondary 72 is connected to terminals 75 and 76 on the member 14.

Output transformers 77 and 78 of "Band 1" and "Band 2" respectively are located on the fixed member 20 and are arranged and constructed in the same manner as are transformers 61 and 70. Thus transformer 77 has primary 79, secondary 80, and an iron core 81. The iron core 81 is used also to tune the output transformer 78. The primary 79 is connected to contact terminals 82 and 83 on the member 20, and the secondary 80 is connected to contact members 85 and 86 on fixed members 21 and 23 respectively. The transformer 78 similarly has a primary 87, and a secondary 88 connected to contact terminals 90 and 91 on the member 20 and contact 92 and 93 on the members 21 and 23 respectively.

The movable member 17 includes a vacuum tube socket formed in the member 17 itself and upon which a vacuum tube 100 is mounted. The tube 100 is a pentode. The electrodes of the tube 100 are the plate 101, suppressor grid 102, screen grid 103, control grid 104, cathode 105, and filament 106. As is common, the suppressor grid 102 is shown connected to the cathode 105. Plate supply power is indicated by positive leads 110 and 111 which connect with contact terminals 112 and 113 on the stationary member 18, that are selectively engaged by a contact making member 136 on the movable member 17. The negative plate supply is indicated by the leads 115 and 116 which are connected with contact terminals 117 and 118 respectively that are mounted on fixed member 16 and are engaged by a contact making member 132 on the movable member 17 in its alternate positions. The terminals 115 and 116 likewise serve as the negative of the filament power supply, the positive thereof being indicated by the leads 119 and 120 and connected respectively to contact terminals 121 and 122 which are on the member 16 and engaged by a contact making member 126 on the movable member 17 in its alternate positions.

The positive side of the filament 106 is connected by lead 125 to the contact strip 126 on the left hand edge of the movable member 17. The negative side of the filament 106 is connected to a ground terminal 127. The cathode 105 is also at ground potential by reason of lead 128. Another ground is conveniently placed at 129, same being connected by lead 130 to a grounded shield 131 and contact strip 132 on left hand edge of member 17. The member 17 carries a screen resistor 133 and its by-pass condenser 134 connected to ground at 129, and the filter condenser 135. The screen grid resistor 133 is connected to the contact strip 136 on the right hand edge of member 17. The grounded terminal 127 is connected by a tube input lead 138 to a contact strip 139 on the left hand side of the movable member 15. The control grid 104 is connected to terminal 140 which in turn is connected by the input ground lead 141 to contact strip 142 on left hand side of the member 15. The plate 101 is connected by tube output lead 143 to a contact strip 144 on the right hand edge of movable member 19. The contact strip 136 and the contact strip 145 are connected together by an output ground lead 146, the strip 145 being located on the right hand edge of the movable member 19.

The input circuit of the tube 100 comprises the two leads 138 and 141, while the output circuit of the tube 100 consists of the two leads 143 and 146. Since the members 15, 17, and 19 move in unison, these leads can be made extremely short, and will move with the tube 100. The principal advantages of my invention evolve from this feature thereof. Since the leads of the input and output circuits of the tube are extremely short, yet are permanently secured to the movable member 17, the shunt capacitance of the leads to ground and between wires is decreased thereby increasing the gain and band width of the amplifier. Likewise, the production of the device is simplified because it is an easy matter to provide the connections and short leads depicted.

An explanation of the operation of the device will now be given. Each of the members 12, 15, 17, 19 and 22 is adapted to slide back and forth to any one of three positions. The position of the ganged members controls the resulting circuit. In Figure 1 the position illustrated is "Band 1" in which the amplifier is arranged to amplify the frequencies occurring in a band capable of being passed by the transformers 61 and 77. The member 12 has elongate contact strips 150 and 151 along the left hand edge and the similar strips 152 and 153 on the right hand edge, said strips being spaced one from the other in a manner to provide the necessary circuit establishing contact. The member 22 carries similarly positioned and constructed contact strips 154, 155, 156 and 157.

In the position shown, the input circuit leads 30 and 31 are connected to the primary 62 via the contact strips 150 and 152, respectively. The contact terminals throughout the entire amplifier are arranged to wipe the contact strips on the edges of the movable members to establish electrical engagement therewith. The secondary 63 of the transformer 61 is connected to the input of the tube 100 via the contact strips 139 and 142, and the conductors 138 and 141.

The output circuit of the tube 100 feeds into the primary 79 of the transformer 77 in the following manner: plate 101, lead 143, contact strip 144, contact terminal 82, primary 79, contact terminal 83, lead 146, contact strip 136, contact terminal 112 to positive plate power lead 110. The secondary 80 of the transformer 77 is connected to feed its output to the output leads 42 and 43 via the contact terminals 85—86 and contact strips 154 and 156 and contact terminals 47 and 52.

In the "Band 1" position described, the tube 100 obtains its operating voltages in the following manner: positive filament voltage terminal 119, contact terminal 121, contact strip 126, lead 125, filament 106, ground terminal 127. The negative plate power and filament voltage terminal 117 which may be considered at ground potential is connected to the contact terminal 117, contact strip 132, and thence to the terminal 129 which is at the same ground potential as the cathode 105 and the terminal 127. Obviously, if there are biasing networks in the cathode circuit, or similar biasing circuit components, these are readily mounted close to the tube 100 and its terminals in the same manner that the screen grid components 133, 134, and 135 are mounted, namely, upon the member 17, and with extremely small leads.

As thus described, the amplifier is arranged so that the transformers 61 and 77 are utilized. The cores 64 and 81 of these transformers are ganged together as indicated at 160 so as to tune them simultaneously.

The next position reached by moving the members 12, 15, 17, 19, and 22 upward is the "off" position where the preamplifier is by-passed. In this position the contact strips 150 and 152 have left the terminals 35 and 41. The contact strips 151 and 153 now bridge the contact terminals 55—36 and 56—40 respectively. In the same manner, contact strip 154 bridges contact terminals 47 and 57 while the contact strip 156 bridges terminals 52 and 58. Thus in the "off" position the entire amplifier is by-passed. The circuit connections are as follows: antenna lead 30, contact terminal 36, contact strip 151, contact terminal 55, lead 59, contact terminal 58, contact strip 156, contact terminal 52 to output lead 43; and lead 31, contact terminal 40, contact strip 153, contact terminal 56, lead 60, contact terminal 57, contact strip 154, contact terminal 47, and output lead 42. In this position the contact strips 126 and 136 are free of any contact terminals so that no power is being supplied to the tube 100.

If the movable members are now slided to their uppermost positions along their respective paths the "Band 2" position is reached. In this position the input of the amplifier is connected to the primary of the transformer 70 the secondary of which feeds into the tube 100, and the output of the tube 100 is fed through the primary of the transformer 78 the secondary of which is connected to the output side of the preamplifier.

In the "Band 2" position the input leads 30 and 31 are connected to supply the input to the tube 100 through the transformer 70 by the following circuits: lead 30, juncture contact terminal 36, contact strip 151, contact terminal 73, primary 71, contact terminal 74, contact strip 153, contact terminal 40 to lead 31. The secondary 72 is connected through the contact terminals 75 and 76 and contact strips 139 and 142, to the tube input leads 138 and 141. On the opposite side of the tube 100 the output leads 143—146 are connected through the contact strips 144—155 to the terminals 90—91 of the primary 87 of the output transformer 78. The secondary of this transformer is connected to the output leads 42—43 by the strips 155 and 157 that bridge the terminals 92—48 and 93—53 respectively.

The tube 100 receives its supply voltages in position "Band 2" over the following circuits: the screen grid voltage is derived from terminal 113 to contact strip 136; positive filament voltage terminal 122 to contact strip 126. The ground potential contact strip 132 is in engagement with the negative filament and plate power terminal 118.

From the above it should be seen that the leads which connect the transformers to the tube 100 are short at any position of use of said transformers, and that under all circumstances, even the power leads of the tube may be made extremely short.

It is also desired to point out that my invention is applicable to amplifiers designed to pass a number of bands greater than two so that more than the positions described are possible.

I have found it a relatively simple matter to shield the important components of the amplifier one from the other. Thus, the input and output halves are shielded by a metallic plate shield 170 which is grounded to terminal 127, and the transformers of the two bands are shielded by a shielding plate 171 which is electrically connected to ground terminal 127 or any other suitable ground in any desired manner. The shielding is illustrated symbolically by means of broken lines.

Figures 2, 3:
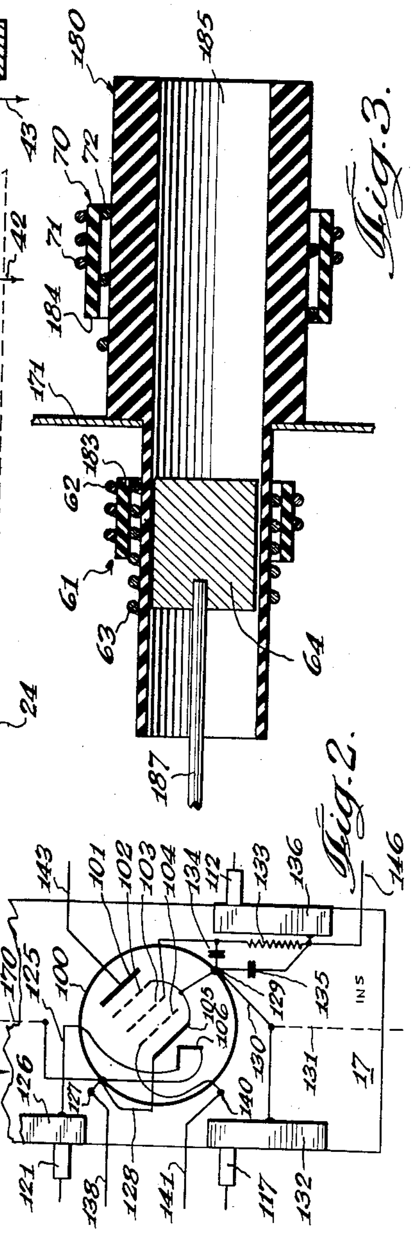
Figure 2 is an enlarged schematic view showing one movable portion of the circuit of Figure 1 for a clearer illustration thereof.
Figure 3 is an enlarged sectional view through a multi-band coil assembly of the amplifier of Figure 1.
Figure 4:
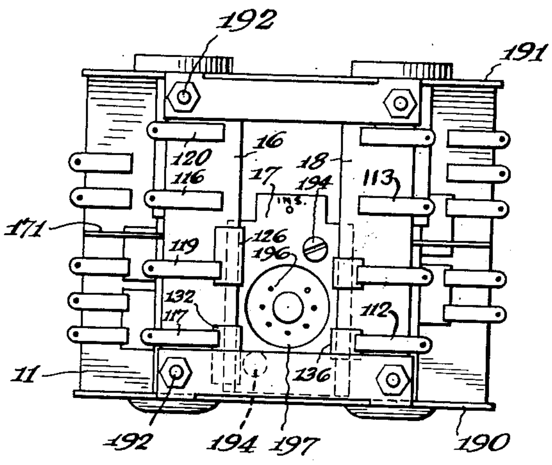
Figure 4 is a top view of one physical structure embodying the present invention, with the wiring connections omitted.
Figures 5, 6:
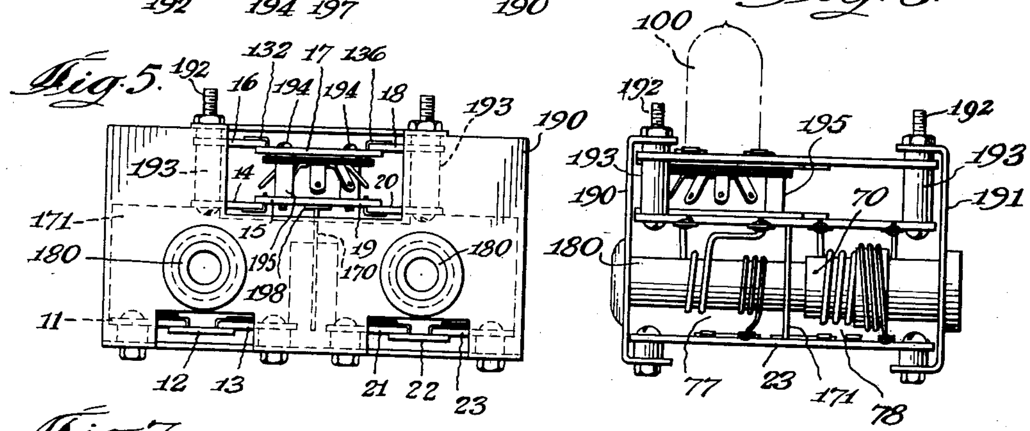
Figure 5 is a front view of the structure of Figure 4.
Figure 6 is a side view of the structure of Figure 4.
Figure 7:
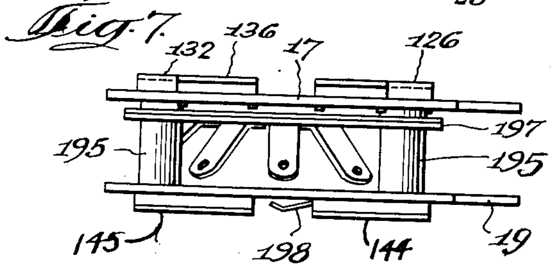
Figures 7, 8 and 9 are enlarged side, top and front views, respectively, of the tube holding movable member of the unit of Figure 4.
Figure 8:
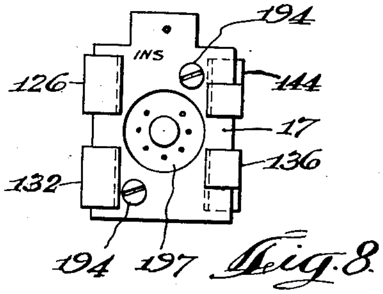
Figure 9:
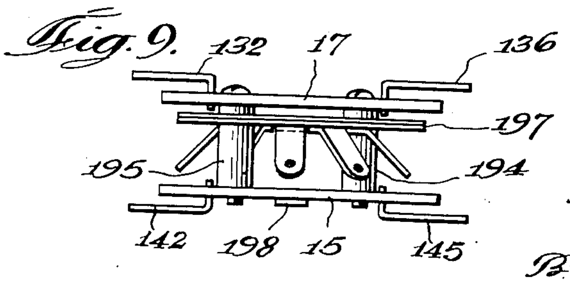

It has been pointed out that the cores of all transformers are secured to move together by any suitable ganging device 160, so that the transformers may be tuned in pairs. In practice the core 64 tunes the input transformers 61—70 of the respective bands, while the core 81 tunes the respective output transformers 78—79. Thus only one core is needed to tune the respective input transformers one a a time, and one core is needed for the respective output transformers. The construction which makes this possible is shown in Figure 3. I have shown transformers 61 and 70 both wound upon the same sleeve or coil form 180. The ends of the form 180 may be of different diameters, as shown, in order to vary the influence of the core upon the transformer. In this case, the two ends are separated by the shielding member 171. The primary and secondary of each transformer is closely coupled with its mate, as shown, and the respective windings may be separated by spacers 183 and 184.

The coil form 180 is provided with a cylindrical bore or passageway 185 which extends throughout the extent thereof. Disposed in the passageway is a piston-like powdered iron core 64 mounted upon an actuating rod 187 and movable longitudinally of the passageway. The construction of the two output transformers is the same as that of the input transformers, and the actuating rods of the input and output transformers are connected together for simultaneous movement.

When the amplifier is operating in "Band 1" position, the cores are disposed, as shown in the drawing, adjacent the transformers 61 and 77 and tuning of the transformers is achieved by incremental movements of the cores relative to the said transformers. If the amplifier is switched to "Band 2," then the cores are bodily moved to the right as viewed in Figure 3 until they are adjacent transformers 70 and 78, and thereafter said transformers are tuned by incremental movements of the cores.

Reference may now be had more particularly to Figures 4 through 9 that show one particular physical construction embodying the present invention. The stationary members 11, 13, 14, 16, 18, 20, 21 and 23 consist of strips of insulation extending between and secured to two sheet metal end plates or brackets 190—191. The four strips 11, 13, 14, and 16 which are of the input circuit are all on one side of the unit and the remaining strips which are of the output circuit are arranged on the opposite side of the unit, the arrangements on the two sides being symmetrical. The strip 14 is immediately below the strip 16 and is suspended therefrom by studs 192, being spaced apart by suitable tubular spacers 193 that surround the studs between the strips 14 and 16. The strips 11 and 13 are both in the same plane, towards the bottom of the unit, and receive the longitudinally slidable strip 12 between them. The movable strips 15 and 19 are really one single wide strip which is suspended from the strip 17 by a pair of studs 194 and suitable tubular spacers 195. In the space between the upper strip 17 and the lower strips 15 and 19 are mounted the impedance accessories for the vacuum tube amplifier including the condenser 136 (Fig. 1) and the resistance there shown. The strip 17 is provided with a circular tube receiving opening under which is mounted a vacuum tube socket 197 having seven holes 196 for receiving corresponding pins on the base of the vacuum tube. The stationary strips 18, 20, 21 and 23 are mounted symmetrically with respect to the corresponding strips 16, 14, 13 and 11. The interconnected strips 17, 15 and 19 are slidable between the strips 16—14 on one side and the strips 18—20 on the other side. The contact strips 126 and 132 ride on the upper surface of the strip 16 and selectively engage the contacts 117, 119, 116 and 120 on the upper surface of the strip 16. The contact strips 139 and 149 (Fig. 1) are mounted on the under side of the strip 15 and engage corresponding contacts on the under side of the strip 14. The contact making arrangement on the output side of the unit is the same as on the input side.

The shield 170 is a metal plate extending between and connected to the brackets 190—191. This plate also performs the function of the shield 131 of Figure 1. The bottom of the strips 15—19 is provided with a contact shoe 198 that slides on the top of the shield 170 (Fig. 5) and thus brings the ground connection to the movable socket assembly. The grounding shield 171 is a metal plate at right angles to the shield 170. The coil forms 180 extend between the brackets 190—191 and through the shield 171.

From the above description it is apparent that the assembled movable members 15, 17 and 19 constitute the movable member of a switch for switching a vacuum tube amplifier from one tunable circuit to another and that the vacuum tube amplifier is mounted directly upon the movable part of the switch. This very substantially reduces the necessary lengths of the conductor leads, thus substantially reducing the production of extraneous noise.

In compliance with the requirements of the patent statutes I have here shown and described a preferred embodiment of my invention. It is, however, to be understood that the invention is not limited to the precise construction here shown, the same being merely illustrative of the principles of the invention. What I consider new and desire to secure by Letters Patent is:

1. A radio frequency amplifier for amplifying in different frequency ranges including input terminals, output terminals, a number of tuning circuits for the respective frequency ranges all located at the input terminal side of the amplifier, a second and corresponding number of tuning circuits for the same frequency ranges all located at the output terminal side of the amplifier, means forming an amplifying vacuum tube socket, and switching means for establishing circuit connections from the input to the output terminals through the socket and selectively through any of the first mentioned tuned circuits in series with a corresponding one of the second mentioned tuned circuits, said switching means including a moving switch assembly, the means forming said vacuum tube socket being on the moving switch assembly.

2. A radio frequency amplifier for amplifying in different frequency ranges including input terminals, output terminals, a number of tuning circuits for the respective frequency ranges all located at the input terminal side of the amplifier, a second and corresponding number of tuning circuits for the same frequency ranges all located at the output terminal side of the amplifier, means forming an amplifing vacuum tube socket, and switching means for establishing circuit connections from the input to the output terminals through the socket and selectively through any of the first mentioned tuned circuits in series with a corresponding one of the second mentioned tuned circuits, said switching means including a moving switch assembly, the means forming said vacuum tube socket being on the moving switch assembly, and impedances for producing the required direct current and radio frequency impedances for the vacuum tube socket, said impedances being mounted on the moving switch assembly.

3. A high frequency amplifier stage having a chassis, input leads, output leads, a plurality of tunable circuits each circuit being adapted to pass frequencies of a different band and each circuit being mounted on the chassis, common variable tuning means for the respective circuits, an electron discharge tube socket, means movably mounting the socket on the chassis and arranged selectively to be positioned in close proximity to any desired one of said circuits, electrical contact terminals for the socket and mounted for movement therewith, each circuit having a set of terminal contacts in a position to be engaged by the socket contact terminals when the socket is positioned relative thereto for coupling the respective circuit therewith.

4. In combination, a first wave band input transformer, a second wave band input transformer, permeability means for variably tuning the two transformers selectively, a first wave band output transformer and a second wave band output transformer, and permeability means for variably tuning the two output transformers selectively, grounded shielding means between the input and the output transformers, grounded shielding means between the two input transformers, grounded shielding means between the two output transformers, a radio frequency amplifier, a support for the amplifier and means for moving the amplifier support from a first position between the input and output transformers of the first band to a second position between the input and output transformers of the second band selectively and means for connecting the amplifier in circuit with the respective transformers between which it has been positioned.

5. In combination, a first wave band input transformer, a second wave band input transformer, permeability means for variably tuning the two transformers selectively, a first wave band output transformer and a second wave band output transformer, and permeability means for variably tuning the two output transformers selectively, grounded shielding means between the input and the output transformers, grounded shielding means between the two input transformers, grounded shielding means between the two output transformers, a first structure on which the respective transformers are mounted, switch contacts on said structure and terminating the respective transformers, a second structure having switch contacts cooperating with the switch contacts on the first structure, means for moving the two structures relatively to effect different connections between the switch contacts of the two structures, circuit modifying means on the second structure, and circuit connections between the modifying means and the contacts of the second structure.

6. In combination, a first wave band input transformer, a second wave band input transformer, each of the two input transformers having spaced axially aligned transformer coils, a magnetic core movable selectively in the coils for variably tuning the two transformers selectively, a first wave band output transformer and a second wave band output transformer, each of the two output transformers having spaced axially aligned transformer coils, a magnetic core movable selectively in the output transformer coils for variably tuning the two output transformers selectively, grounded shielding means between the input and the output transformers, grounded shielding means between the two input transformers, grounded shielding means between the two output transformers, a first structure on which the respective transformers are mounted, switch contacts on said structure and terminating the respective transformers, a second structure having switch contacts cooperating with the switch contacts on the first structure, means for moving the two structures relatively to effect different connections between the switch contacts of the two structures, circuit modifying means on the second structure, and circuit connections between the modifying means and the contacts of the second structure.

7. In combination, a first wave band input transformer, a second wave band input transformer, a single magnetic core movable selectively in the magnetic fields of the two transformers for variably tuning the two transformers selectively, a first wave band output transformer and a second wave band output transformer, a single magnetic core movable selectively in the magnetic fields of the output transformers for variably tuning the two output transformers selectively, grounded shielding means between the input and the output transformers, grounded shielding means between the two input transformers, grounded shielding means between the two output transformers, circuit modifying means connecting the input and output transformers of the first band and of the second band selectively, a first structure on which the respective transformers are mounted, switch contacts on said structure and terminating the respective transformers, a second structure having switch contacts cooperating with the switch contacts on the first structure, means for moving the two structures relatively to effect different connections between the switch contacts of the two structures, the circuit modifying means being mounted on the second structure, and circuit connections between the circuit modifying means and the contacts of the second structure.

8. In combination, a first wave band input transformer, a second wave band input transformer, each of the two input transformers having spaced axially aligned transformer coils, a magnetic core movable selectively in the coils for variably tuning the two transformers selectively, a first wave band output transformer and a second wave band output transformer each of the two output transformers having spaced axially aligned transformer coils, a magnetic core movable selectively in the output transformer coils for variably tuning the two output transformers selectively, grounded shielding means between the input and the output transformers, grounded shielding means between the two input transformers, grounded shielding means between the two output transformers, circuit modifying means, and means for connecting the modifying means between the input and output transformers of the first band and of the second band selectively, a first structure on which the respective transformers are mounted, switch contacts on said structure and terminating the respective transformers, a second structure having switch contacts cooperating with the switch contacts on the first structure, means for moving the two structures relatively to effect different connections between the switch contacts of the two structures, the circuit modifying means being mounted on the second structure, circuit connections between the circuit modifying means and the contacts of the second structure, the second structure and one of said grounded shielding means on the first structure having cooperating sliding contacts for maintaining a ground connection between the two relatively movable structures.

9. A high frequency amplifier stage adapted to be interposed in an electrical circuit, and including a chassis, an amplifying electron discharge tube socket having input and output connections, said stage having separate tuned circuits for each of a number of different frequency bands, means for selecting each band with connections for associating each of said circuits with the tube socket, means for moving the tube socket relative to the chassis to positions along a predetermined path, and said input and output connections having contact terminals movable with said socket, said tuned circuits being on the chassis one adjacent each of said positions and the connections of each of said tuned circuits having contact terminals adapted cooperatively to engage with the said first mentioned contact terminals when said socket has been moved to the corresponding position whereby to provide amplification of only the frequency band corresponding to the selected tuned circuit means.

10. Apparatus of the class described comprising a chassis, an electron discharge tube socket, and a plurality of tunable circuits mounted on the chassis each adapted to pass a frequency band, and each having a group of electrical contact terminals adapted to enable said vacuum tube socket to be connected therewith, a mounting member for said socket movable relative to the chassis and having contact terminals connected with the electrical parts of the socket, means for moving said mounting member selectively to any one of a plurality of positions bringing the associated contact terminals thereof into proper engagement with the respective contact terminals of a predetermined one of said circuits, and means for supplying proper operating voltages to the said socket at all positions.

11. In a high frequency multiband amplifier, a chassis, input leads mounted on the chassis, a plurality of tunable band pass circuits mounted on the chassis each having a primary and a secondary, an electron discharge tube, means fixedly secured to the chassis adapted to supply operating d. c. voltages to said tube, sliding means mounting said tube, means for moving said slidable means to any one of a plurality of stations, said slidable means having contact terminals connected with the tube electrodes and adapted selectively to be positioned at any one of said plurality of stations each corresponding to a different frequency band, said d. c. voltage supplying means and the input leads having contact terminals at each of said stations, the circuits each having its contact terminals at a different station, and slidable contact carrying switch means ganged for simultaneous movement with said tube mounting means whereby at any selected station said input leads will be connected with one primary, while the associated secondary will be connected in input relationship with the tube, and the d. c. voltage supplying means will be connected with the tube.

12. In combination, a first wave band input transformer, a second wave band input transformer, a single magnetic core movable selectively in the magnetic fields of the two transformers for variably tuning the two transformers selectively, a first wave band output transformer, a second wave band output transformer, a single magnetic core movable selectively in the magnetic fields of the two output transformers for variably tuning the two output transformers selectively, grounded shielding means between the input and the output transformers and means for establishing circuit connections between the output sides of the input transformers and the input sides of the output transformers.

13. In combination, a first wave band input transformer, a second wave band input transformer, a single magnetic core movable selectively in the magnetic fields of the two transformers for variably tuning the two transformers selectively, a first wave band output transformer, a second wave band output transformer, a single magnetic core movable selectively in the magnetic fields of the two output transformers for variably tuning the two output transformers selectively, grounded shielding means between the input and the output transformers, and means for establishing circuit connections between the output sides of the input transformers and the input sides of the output transformers, said circuit connections including a radio frequency amplifier and switching means for connecting the amplifier between the two first wave band transformers or the two second wave band transformers selectively.

14. Electrical band switching apparatus for selectively inserting a plurality of frequency-band-determining elements in a circuit including an electron discharge device, comprising a stationary chassis support means for supporting said frequency-band-determining elements; a movable support member for carrying said electron discharge device; means constituting a source of energizing voltage for said discharge device on said chassis support means; a first set of contact terminals movable with said movable support member and connecting directly with the electrodes of said electron discharge device; a plurality of stationary contact terminals on said stationary chassis support connecting with said frequency-band-determining elements and the source of energizing voltage for said electron discharge device; said stationary and movable terminal contacts being arranged for engaging relationship to progressively connect different frequency-band-determining elements with said electron discharge device as said movable support member is progressively moved relative to said chassis support means and to connect the said source of energizing voltage to said electron discharge device in each band position.

15. High frequency band switching apparatus comprising a stationary chassis support means having a plurality of opposed panel members forming respective elongated slots therebetween, respective movable support members slidably disposed in said slots, means for simultaneously moving said support member in said slots, cooperating terminal contact members mounted along contiguous sides of said chassis and movable support members, frequency-band-determining elements supported on said stationary chassis means, electron discharge device means supported on at least one of said movable support members, means connecting the electrodes of said electron discharge device and the frequency-band-determining elements to appropriate contact terminals on the associated supporting member, said terminal contact members cooperatively arranged to progressively connect said respective frequency-band-determining elements to appropriate electrodes of said electron discharge device as said movable members are progressively moved in said slots.

16. The combination of claim 15 characterized further by a source of energizing voltage for said electron discharge device on said fixed chassis support means, means connecting said source of voltage to said electron discharge device through cooperating terminal contacts on said fixed chassis means and said movable support.

17. The combination of claim 15 characterized further by means mounting some of said respective opposed panel members and the removable members supported therebetween one above the other to form a compact unit.

18. Electrical band switching apparatus for selectively inserting a first and second plurality of stationary frequency-band-determining elements respectively between a pair of input conductors and the input electrodes of an electron discharge device, and also between the output electrodes of said electron discharge device and a pair of out conductors comprising a first set of fixed contact terminals connected to said input conductors, a second set of fixed contact terminals connected to said output conductors, a third and fourth set of fixed contact terminals connected respectively to the input and output of the frequency determining elements to be connected to the input electrodes of said discharge device, a fifth and sixth set of stationary contact terminals connected to the respective input and output of the frequency determining elements to be connected to the output electrodes of said discharge device, a first movable support member carrying bridging contacts thereon positioned for successive sliding engagement with said first and third set of contact terminals for connecting said input conductors successively to different frequency determining elements as said movable support member is moved from one position to another, a second movable support member carrying bridging contacts thereon positioned for successive sliding engagement with said second and sixth set of contact terminals for connecting said output conductors successively to different frequency-band-determining elements, additional fixed contact terminals connected to a source of energizing voltage for said electron discharge device, a third movable support member carrying said electron discharge device, a plurality of contact terminals movable with said electron discharge device positioned respectively for continuous sliding engagement with said contact terminals connected to said source of energizing voltage and for successive sliding engagement with said fourth and fifth set of contact terminals for connecting said electron discharge device successively to different frequency band determining elements, and means for moving said movable support members and movable contact members in unison whereby band switching is accomplished.

19. A compact band switching unit comprising a first pair of opposed, separated stationary support members, a first movable support member, means for slidably supporting said first movable support member between said first pair of stationary support members, an electron discharge device having input and output electrodes, means for mounting said electron discharge device on said first movable support member, juxtaposed contact terminals on the adjoining edges of said first movable support member and said stationary support members, shielding means extending at right angles from said movable support members, a first plurality of frequency-band-determining elements for connection to input electrodes of said electron discharge device, a second plurality of frequency-band-determining elements for connection to the output electrodes of said electron discharge device, means supporting said first plurality of frequency-band-determining elements on one side of said shielding means, means supporting said second plurality of frequency determining elements on the other side of said shielding means, connecting means coupling said first and second plurality of frequency-band-determining means respectively to the contact terminals on the nearest one of said stationary opposed support members, means connecting said input and output electrodes of said discharge device respectively to contact terminals on opposite sides of said movable support member, said latter contact terminals positioned for successive contact with the adjacent contact terminals on said movable support member as movable support member is moved from one position to another to successively couple one of said first and second plurality of frequency selective elements respectively to said input and output electrodes of said electron discharge device.

WILLIAM A. CLAPS.

References Cited in the file of this patent

UNITED STATES PATENTS

| Number | Name | Date |
|---|---|---|
| 2,075,396 | Keim | Mar. 30, 1937 |
| 2,150,553 | Koch | Mar. 14, 1939 |
| 2,244,023 | Sauer | June 3, 1941 |
| 2,505,862 | Kallman | May 2, 1950 |
| 2,555,520 | Torre | June 5, 1951 |

FOREIGN PATENTS

| Number | Country | Date |
|---|---|---|
| 390,348 | Great Britain | Apr. 6, 1933 |